United States Patent
Kim et al.

(10) Patent No.: US 9,048,452 B2
(45) Date of Patent: Jun. 2, 2015

(54) METHOD FOR MANUFACTURING TRANSPARENT ELECTRODE OF ORGANIC LIGHT EMITTING DISPLAY DEVICE AND ORGANIC LIGHT EMITTING DISPLAY DEVICE USING THE TRANSPARENT ELECTRODE

(71) Applicants: Hun Kim, Yongin (KR); Jin-Woo Park, Yongin (KR); Jai-Hyuk Choi, Yongin (KR)

(72) Inventors: Hun Kim, Yongin (KR); Jin-Woo Park, Yongin (KR); Jai-Hyuk Choi, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 0 days.

(21) Appl. No.: 13/935,354

(22) Filed: Jul. 3, 2013

(65) Prior Publication Data

US 2014/0217368 A1    Aug. 7, 2014

(30) Foreign Application Priority Data

Feb. 5, 2013  (KR) .................. 10-2013-0012939

(51) Int. Cl.
*H01L 21/00* (2006.01)
*H01L 51/52* (2006.01)

(52) U.S. Cl.
CPC .................... *H01L 51/5203* (2013.01)

(58) Field of Classification Search
USPC ............... 438/22, 84, 99, 166; 257/40, 43, 88
See application file for complete search history.

(56) References Cited

U.S. PATENT DOCUMENTS

| 7,615,921 B2 | 11/2009 | Kimura | |
|---|---|---|---|
| 8,268,194 B2 | 9/2012 | Kim et al. | |
| 2012/0024695 A1* | 2/2012 | Black | 204/192.29 |
| 2012/0097424 A1* | 4/2012 | Jo et al. | 174/126.4 |
| 2012/0132935 A1* | 5/2012 | Isobe et al. | 257/88 |
| 2012/0196117 A1* | 8/2012 | Chang et al. | 428/336 |
| 2013/0140547 A1* | 6/2013 | Lee et al. | 257/40 |

FOREIGN PATENT DOCUMENTS

| KR | 10-1996-0014651 | 10/1996 |
|---|---|---|
| KR | 10-2006-0040545 | 5/2006 |
| KR | 10-2008-0076747 | 8/2008 |
| WO | 2011/061922 | 5/2011 |

* cited by examiner

*Primary Examiner* — Phuc Dang
(74) *Attorney, Agent, or Firm* — Robert E. Bushnell, Esq.

(57) ABSTRACT

A method for manufacturing an organic light emitting display device includes mounting in a chamber a substrate where a transparent electrode is to be formed and a SnO member that is a source of forming the transparent electrode, injecting argon gas and oxygen into the chamber, and evaporating the SnO member to be deposited on the substrate.

14 Claims, 2 Drawing Sheets

| Case | O₂/power (sccm/A) | Resistance (Ω/□) |
|---|---|---|
| 1 | 0 | 45,000 |
| 2 | 0.2 | 22,000 |
| 3 | 1 | 430,000 |
| 4 | 1.9 | 20 |
| 5 | 2 | 17 |
| 6 | 2.9 | 20 |
| 7 | 3.3 | 70 |

METHOD FOR MANUFACTURING TRANSPARENT ELECTRODE OF ORGANIC LIGHT EMITTING DISPLAY DEVICE AND ORGANIC LIGHT EMITTING DISPLAY DEVICE USING THE TRANSPARENT ELECTRODE

CLAIM OF PRIORITY

This application makes reference to, incorporates the same herein, and claims all benefits accruing under 35 U.S.C. §119 from an application earlier filed in the Korean Intellectual Property Office on 5 Feb. 2013 and there duly assigned Serial No. 10-2013-0012939.

BACKGROUND OF THE INVENTION

1. Field of the Invention

An embodiment of the present invention relates to a transparent electrode used for an organic light emitting display device, and more particularly, to a method for manufacturing a transparent electrode of an organic light emitting display device, which may reduce resistance heat of the transparent electrode, and an organic light emitting display device using the transparent electrode.

2. Description of the Related Art

In general, an organic light emitting display device implements colors in a principle of emitting light by combining holes and electrode respectively injected by an anode and a cathode in a light emitting layer. The organic light emitting display device has a stack type structure in which a light emitting layer is interposed between a pixel electrode that is an anode and an opposed electrode that is a cathode.

A unit pixel of the organic light emitting display device consists of subpixels of a red pixel, a green pixel, and a blue pixel. A desired color may be presented by a combination of three subpixels. In other words, each subpixel has a structure in which a light emitting layer for emitting light of any one of red, green, and blue colors is interposed between the two electrodes. A color of a unit pixel may be presented by an appropriate combination of the three color lights.

Of the pixel electrode and the opposed electrode, one side where an image is produced is formed of a transparent electrode and the other side is formed of a reflective electrode. Typically, a reflective electrode is formed of a metal material and a transparent electrode is formed of an ITO or IZO material.

The transparent electrode of an ITO or IZO material however has higher resistance compared to the metal material and thus resistance heat is much generated during operation. In other words, since the transparent electrode of an ITO or IZO material normally has a surface resistance of about 50 $\Omega/\square$ or higher, resistance heat is much generated during operation. Accordingly, heat loss increases and thus the properties of each subpixel are quickly degraded due to overheat. Therefore, to produce more reliable products, a method for manufacturing a transparent electrode having low resistance heat is needed.

The above information disclosed in this Background section is only for enhancement of understanding of the background of the described technology and therefore it may contain information that does not form the prior art that is already known in this country to a person of ordinary skill in the art.

SUMMARY OF THE INVENTION

An embodiment of the present invention provides a method for manufacturing a transparent electrode of an organic light emitting display device, which may reduce resistance heat of the transparent electrode, and an organic light emitting display device using the transparent electrode.

In accordance with an aspect of the present invention, a method for manufacturing an organic light emitting display device includes mounting in a chamber a substrate where a transparent electrode is to be formed and a SnO (tin oxide) member that is a source of the transparent electrode, injecting argon gas and oxygen into the chamber, and evaporating the SnO member to be deposited on the substrate.

The evaporation of the SnO member may include forming plasma around the SnO member and evaporating the SnO member by heat of the plasma.

An amount of the oxygen injected into the chamber may be in a range of about 1.9 sccm/A~about 2.9 sccm/A with respect to a current applied to form the plasma.

An amount of the argon gas injected into the chamber may be about 40 sccm.

An internal pressure of the chamber may be about 0.34 Pa~about 0.36 Pa.

In accordance with another aspect of the present invention, an organic light emitting display device includes a plurality of subpixels in which a transparent electrode and a reflective electrode are arranged to face each other with a light emitting layer interposed between the transparent electrode and the reflective electrode. The transparent electrode is formed of a SnO material.

The transparent electrode may have a surface resistance of about 20 $\Omega/\square$ or lower.

The transparent electrode may be formed in a chamber where a SnO member that is a source is evaporated by plasma.

During formation of the transparent electrode, an amount of oxygen injected into the chamber may be in a range of about 1.9 sccm/A~about 2.9 sccm/A with respect to a current applied to form the plasma.

During formation of the transparent electrode, an amount of the argon gas injected into a chamber may be about 40 sccm.

During formation of the transparent electrode, an internal pressure of a chamber may be about 0.34 Pa~about 0.36 Pa.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
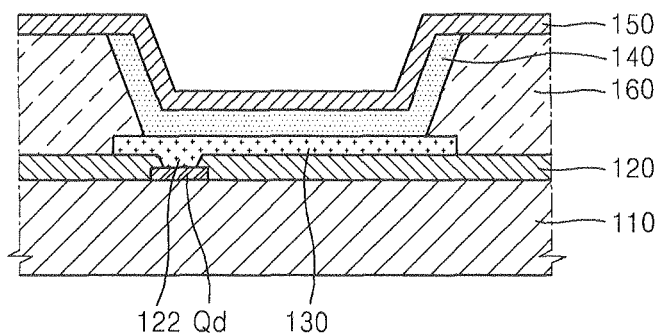
FIG. 1 is a cross-sectional view schematically illustrating a structure of a subpixel of an organic light emitting display device according to an embodiment of the present invention.

The attached drawings for illustrating exemplary embodiments of the present invention are referred to in order to gain a sufficient understanding of the present invention, the merits thereof, and the objectives accomplished by the implementation of the present invention. Hereinafter, the present invention will be described in detail by explaining exemplary embodiments of the invention with reference to the attached drawings. Like reference numerals in the drawings denote like elements.

Figure 2:
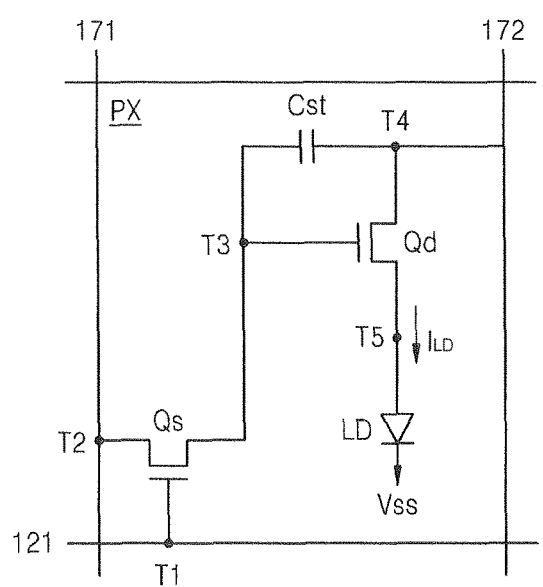
FIG. 2 is an equivalent circuit diagram of the subpixel of FIG. 1.

FIG. 1 is a cross-sectional view schematically illustrating a structure of a subpixel of an organic light emitting display device according to an embodiment of the present invention. FIG. 2 is an equivalent circuit diagram of the subpixel of FIG. 1. The unit pixel includes subpixels of three colors of a red subpixel R, a green subpixel G, and a blue subpixel B. FIG. 1 illustrates any one of the subpixels and other subpixels are formed to have a similar structure. Also, in an organic light emitting display device, unit pixels each including the three color subpixels are repeatedly arranged along a column direction and a row direction.

First, in reference to FIG. 2 illustrating an equivalent circuit diagram, a plurality of signal lines 121, 171, and 172 are connected to a subpixel PX. The signal lines 121, 171, and the 172 include a scanning signal line 121 for transmitting a gate signal or a scanning signal, a data line 171 for transmitting a data signal, and a drive voltage line 172 for transmitting a drive voltage.

The subpixel PX includes a switching transistor Qs, a drive transistor Qd, a storage capacitor Cst, and an organic light emitting device LD. The switching transistor Qs includes a control terminal T1, an input terminal T2, and a control terminal T3. The control terminal T1, the input terminal T2, and the control terminal T3 are connected to the scanning signal line 121, the data line 171, and the drive transistor Qd, respectively. The switching transistor Qs in response to a scanning signal received through the scanning signal line 121 transmits a data signal received through the data line 171 to the drive transistor Qd.

The drive transistor Qd includes the control terminal T3, an input terminal T4, and an output terminal T5. The control terminal T3, the input terminal T4, and the output terminal T5 are connected to the switching transistor Qs, the drive voltage line 172, and the organic light emitting device LD, respectively. The control terminal T3 in the switching transistor Qs functions as the control terminal T3 for the drive transistor Qd. The terminal T3 flows an output current $I_{LD}$ whose amount varies according to a voltage applied between the control terminal T3 and the output terminal T5.

The capacitor Cst is connected between the control terminal T3 and the input terminal T4 of the drive transistor Qd. The capacitor Cst charges a data signal applied to the control terminal T3 of the drive transistor Qd and maintains the charged data signal after the switching transistor Qs is turned off.

The organic light emitting device LD includes a pixel electrode (hereinafter, referred to as the transparent electrode) connected to the output terminal T5 of the drive transistor Qd, an opposed electrode (hereinafter, referred to as the reflective electrode) connected to a common voltage Vss, and a light emitting layer interposed between the transparent electrode and the reflective electrode. Light emission occurs in the light emitting layer by a voltage applied between the transparent electrode and the reflective electrode.

A detailed structure of the organic light emitting device LD will be described below with reference to the subpixel structure of FIG. 1.

In reference to FIG. 1, a plurality of drive transistors Qd are formed on an insulating substrate 110 formed of a transparent glass or plastic material. Although they are not illustrated in the cross-section of FIG. 1, the switching transistor Qs and the signal lines 121, 171, and the 172 are formed on the insulating substrate 110.

A transparent electrode 130 is formed on the drive transistor Qd to be connected to the drive transistor Qd through a contact hole 122 of an insulating layer 120. A light emitting layer 140 is formed in a pixel define layer 160 and a reflective electrode 150 is formed on the light emitting layer 140. In this state, when a voltage is applied between the transparent electrode 130 and the reflective electrode 150 by the drive transistor Qd and the common voltage Vss, light is emitted from the light emitting layer 140 and an image is formed toward the transparent electrode 130.

In the present invention, the transparent electrode 130 is formed of a SnO material exhibiting a low resistance characteristic so that resistance heat is not much generated during operation. In other words, since a contemporary transparent electrode formed of an ITO or IZO material has a surface resistance of about 50 Ω/□ or higher, resistance heat is much generated. However, the transparent electrode 130 formed of a SnO material has a surface resistance of about 20 Ω/□ or lower, resistance heat is not much generated. Thus, such problems as heat loss due to resistance heat and early degradation of a pixel due to overheat may be prevented.

Figures 3, 4:
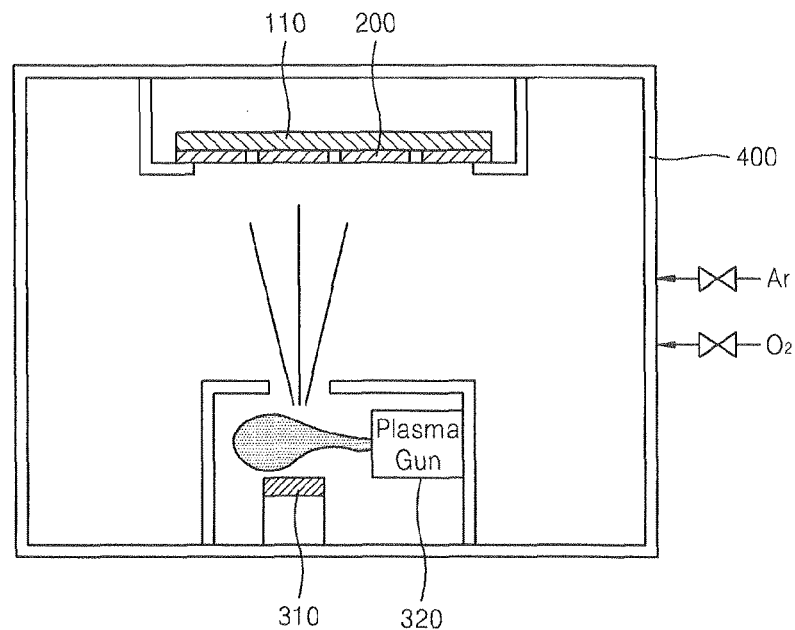
FIG. 3 is a view schematically illustrating the interior of a chamber for a plasma coating process to form a transparent electrode of the subpixel of FIG. 1.
FIG. 4 is a table showing a comparison between an oxygen injection amount and a surface resistance value of a transparent electrode manufactured by the plasma coating process of FIG. 3.

The transparent electrode 130 that is formed of a SnO material and has lower resistance may be manufactured by a plasma coating process as illustrated in FIG. 3. In other words, the insulating substrate 110 where the transparent electrode 130 is to be formed is mounted in a chamber 400 for performing plasma coating and a SnO member 310 as a deposition source is mounted at a position facing the insulating substrate 110. A mask 200 is provided on a lower surface of the insulating substrate 110.

While the interior of the chamber 400 is maintained at a pressure of about 0.34 Pa~about 0.36 Pa, argon gas and oxygen are injected into the chamber 400. The injection amount of argon gas is constantly maintained at about 40 sccm. Then, to evaporate the SnO member 310, current is applied to a plasma gun 320. The oxygen is injected in such an amount to maintain a proportional relationship with the current applied to the plasma gun 320. In other words, to form plasma, an amount of oxygen in a range of about 1.9 sccm/A~about 2.9 sccm/A is injected with respect to the current A applied to the plasma gun 320. For example, when a current of about 50 A is applied to the plasma gun 320, oxygen is injected in an amount of about 100 sccm.

As a result, the transparent electrode 130 formed of a SnO material may be quite uniformly formed on the insulating substrate 110. If the oxygen injection amount is too higher or lower than the above level, not only SnO but also Sn and $SnO_2$ are much generated. When the layer of the transparent electrode 130 is irregularly formed, a desired low resistance characteristic may not be obtainable and rather a resistance value is greatly increased. However, when plasma coating is performed while injecting oxygen in an amount of about 1.9 sccm/A~about 2.9 sccm/A as described above, the transparent electrode 130 is uniformly formed of a SnO material so that a low resistance characteristic may be obtained.

Thus, as plasma is formed by applying current to the plasma gun 320, the SnO member 310 that is a source is evaporated. In doing so, by injecting oxygen in a range of about 1.9 sccm/A~about 2.9 sccm/A into the chamber 400, the transparent electrode 130 having a lower resistance characteristic may be formed.

FIG. 4 is a table showing a comparison between an oxygen injection amount and a surface resistance value of the transparent electrode 130 manufactured by the plasma coating process of FIG. 3. In FIG. 4, while variously changing the oxygen injection amount, a surface resistance value of the transparent electrode 130 formed accordingly is measured.

As it may be seen from the table in FIG. 4, when the oxygen injection amount is in a range of about 1.9 sccm/A~about 2.9 sccm/A, the surface resistance value of the transparent electrode 130 is about 20 Ω/□ or lower. In contrast, when the oxygen injection amount is lower or higher than the above range, the surface resistance value of the transparent electrode 130 is increased higher than that of ITO or IZO. This is because, as described above, although the transparent electrode 130 is uniformly formed of a SnO material when the oxygen injection amount is within a range of about 1.9 sccm/A~about 2.9 sccm/A, not only SnO but also Sn and $SnO_2$ are much generated when the oxygen injection amount exceeds the above range and thus a resistance value is increased.

As a result, the transparent electrode 130 having a surface resistance value of about 20 Ω/□ or lower may be obtained by performing deposition while maintaining the oxygen injection amount in a range of about 1.9 sccm/A~about 2.9 sccm/A such that the oxygen injection amount maintains a predetermined proportional relationship with the current applied to form plasma.

Thus, when a low resistance transparent electrode is formed by the above manufacturing method, the problem that resistance heat is much generated during operation may be solved and the problem that early degradation of a pixel due to overheat may be prevented, thereby further improving reliability of a product.

As described above, according to the method for manufacturing a transparent electrode according to the present invention and the organic light emitting display device using the transparent electrode, a transparent electrode having low resistance is implemented and thus resistance heat is reduced. Thus, the problems such as an increase in heat loss by high resistance heat and a faster degradation of the properties of a subpixel may be solved. Also, more reliable products may be produced by adopting the above method and the above transparent electrode.

While this invention has been particularly shown and described with reference to exemplary embodiments thereof, it will be understood by those skilled in the art that various changes in form and details may be made therein without departing from the spirit and scope of the invention as defined by the appended claims.

What is claimed is:

1. A method for manufacturing an organic light emitting display device, the method comprising:
   preparing a substrate;
   forming a transparent electrode on the substrate, the formation of the transparent electrode comprising steps of:
      mounting in a chamber the substrate on which a transparent electrode is to be formed and a SnO member that is a source for forming the transparent electrode;
      injecting argon gas and oxygen into the chamber; and
      evaporating the SnO member to be deposited on the substrate;
   forming a light emitting layer on the substrate; and
   forming a reflective electrode on the substrate so that the light emitting layer is disposed between the transparent electrode and the reflective electrode.

2. The method of claim 1, wherein the evaporation of the SnO member comprises:
   forming plasma around the SnO member; and
   evaporating the SnO member by heat of the plasma.

3. The method of claim 2, wherein an amount of the oxygen injected into the chamber is in a range of about 1.9 sccm/A~about 2.9 sccm/A with respect to a current applied to form the plasma.

4. The method of claim 1, wherein an amount of the argon gas injected into the chamber is about 40 sccm.

5. The method of claim 1, wherein an internal pressure of the chamber is about 0.34 Pa~about 0.36 Pa.

6. An organic light emitting display device comprising:
   a plurality of subpixels in which a transparent electrode and a reflective electrode are arranged to face each other with a light emitting layer interposed between the transparent electrode and the reflective electrode, and
   with the transparent electrode being formed from a SnO material.

7. The organic light emitting display device of claim 6, wherein the transparent electrode has a surface resistance of about 20Ω/□ or lower.

8. The organic light emitting display device of claim 6, wherein the transparent electrode is formed in a chamber where a SnO member that is a source is evaporated by plasma.

9. The organic light emitting display device of claim 8, wherein, during formation of the transparent electrode, an amount of oxygen injected into the chamber is in a range of about 1.9 sccm/A~about 2.9 sccm/A with respect to a current applied to form the plasma.

10. The organic light emitting display device of claim 6, wherein, during formation of the transparent electrode, an amount of the argon gas injected into a chamber is about 40 sccm.

11. The organic light emitting display device of claim 6, wherein, during formation of the transparent electrode, an internal pressure of a chamber is about 0.34 Pa~about 0.36 Pa.

12. An organic light emitting display device manufactured by the method of claim 1, comprising:
   the transparent electrode formed on the substrate from the SnO material deposited on the substrate,
   a plurality of subpixels in which the transparent electrode and the reflective electrode are arranged to face each other and the light emitting layer interposed between the transparent electrode and the reflective electrode, and
   the transparent electrode being formed from the SnO material.

13. An organic light emitting display device manufactured by the method of claim 1, comprising:
   the transparent electrode formed on the substrate from the SnO material deposited on the substrate, and
   a plurality of subpixels in which the transparent electrode is formed from the SnO material having a surface resistance of about 20Ω/□ or lower and the reflective electrode face each other, and the light emitting layer is interposed between the transparent electrode and the reflective electrode.

14. An organic light emitting display device manufactured by the method of claim 2, comprising:
   the transparent electrode formed on the substrate from the SnO material deposited on the substrate, and
   a plurality of subpixels in which the transparent electrode is formed from the SnO material having a surface resistance of about 20Ω/□ or lower and the reflective electrode face each other, and the light emitting layer is interposed between the transparent electrode and the reflective electrode.

* * * * *